United States Patent
Park et al.

(10) Patent No.: US 8,709,942 B2
(45) Date of Patent: Apr. 29, 2014

(54) METHODS FOR FABRICATING SEMICONDUCTOR DEVICES

(75) Inventors: Sang-Jine Park, Yongin-si (KR); Kee-Sang Kwon, Seoul (KE); Doo-Sung Yun, Suwon-si (KR); Bo-Un Yoon, Seoul (KR); Il-Young Yoon, Hwaseong-si (KR); Jeong-Nam Han, Seoul (KR)

(73) Assignee: Samsung Electronics Co., Ltd. (KR)

( * ) Notice: Subject to any disclaimer, the term of this patent is extended or adjusted under 35 U.S.C. 154(b) by 23 days.

(21) Appl. No.: 13/488,478

(22) Filed: Jun. 5, 2012

(65) Prior Publication Data

US 2013/0023119 A1   Jan. 24, 2013

(30) Foreign Application Priority Data

Jul. 18, 2011   (KR) .................. 10-2011-0071115

(51) Int. Cl.
*H01L 21/4763*   (2006.01)

(52) U.S. Cl.
USPC ........... 438/637; 438/638; 438/640; 438/643; 257/E21.579

(58) Field of Classification Search
USPC .................. 438/637, 638, 639, 640, 643; 257/E21.579
See application file for complete search history.

(56) References Cited

U.S. PATENT DOCUMENTS

| | | | |
|---|---|---|---|
| 6,872,666 B2 * | 3/2005 | Morrow | 438/700 |
| 7,141,507 B2 * | 11/2006 | Genz et al. | 438/719 |
| 7,393,777 B2 * | 7/2008 | Cooney et al. | 438/637 |
| 7,659,196 B2 | 2/2010 | Abdelrahman et al. | |
| 2010/0055897 A1 | 3/2010 | Chou et al. | |
| 2012/0129337 A1 * | 5/2012 | Chen et al. | 438/636 |

FOREIGN PATENT DOCUMENTS

| | | |
|---|---|---|
| JP | 2009004665 | 1/2009 |
| JP | 2010050117 | 3/2010 |

* cited by examiner

*Primary Examiner* — Long K Tran
(74) *Attorney, Agent, or Firm* — Onello & Mello, LLP

(57) ABSTRACT

In a method for fabricating a semiconductor device, a substrate is provided including an interlayer dielectric layer and first and second hard mask patterns sequentially stacked thereon. A first trench is provided in the interlayer dielectric layer through the second hard mask pattern and the first hard mask pattern. A filler material is provided on the interlayer dielectric layer and the second hard mask pattern to fill the first trench. An upper portion of the second hard mask pattern is exposed by partially removing the filler material. The second hard mask pattern is removed, and remaining filler material is removed from the first trench. A wiring is formed by filling the first trench with a conductive material.

20 Claims, 33 Drawing Sheets

FIG. 23a
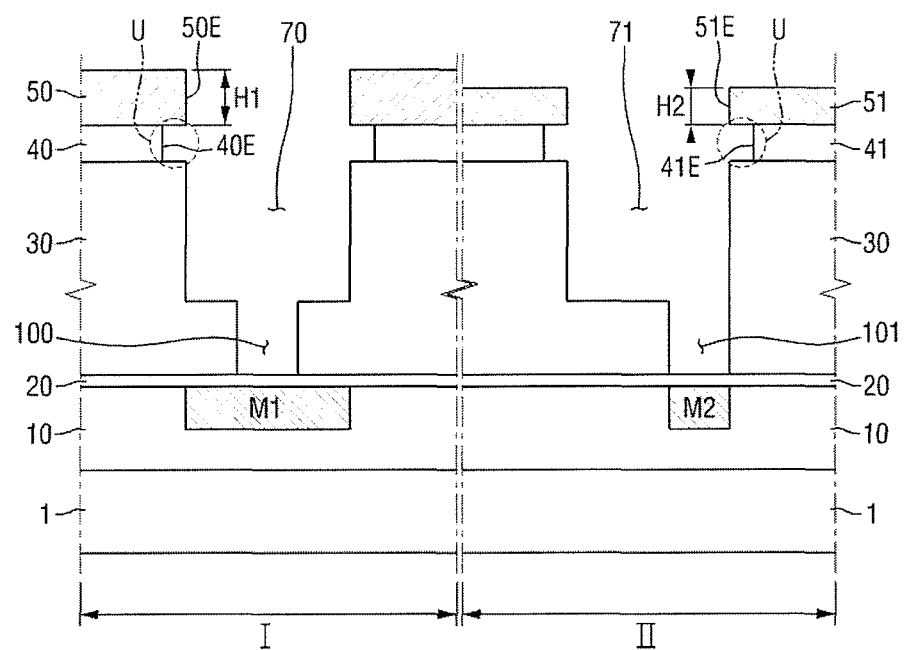
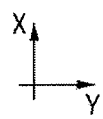

METHODS FOR FABRICATING SEMICONDUCTOR DEVICES

CROSS-REFERENCE TO RELATED APPLICATION

This application claims priority under 35 USC 119 from Korean Patent Application No. 10-2011-0071115 filed on Jul. 18, 2011 in the Korean Intellectual Property Office, the content of which is incorporated herein by reference, in its entirety.

BACKGROUND

1. Field

Embodiments of the present inventive concepts relate to methods for fabricating semiconductor devices.

2. Description of the Related Art

In the fabrication of semiconductor-based transistor devices, it is commonplace for photo masks to be employed for the various required etching steps. However, with increased integration of semiconductor devices, the number of required etching steps is increasing, as is the depth of an etched feature relative to its width. Accordingly, the resulting processing variation can increase by a proportional amount. In order to minimize processing variation, a hard mask process has recently been proposed to perform etching steps. More recently, in order to increase etching selectivity, a metal hard mask has also been introduced.

SUMMARY

Embodiments of the present inventive concepts provide a method for fabricating a semiconductor device, which can form a damascene-type wire in a manner that offers improved reliability and improved processing efficiency. This can result in a device that offers reduced process variation and improved reliability.

In an aspect, a method for fabricating a semiconductor device comprises: providing a substrate including an interlayer dielectric layer and first and second hard mask patterns sequentially stacked thereon; providing a first trench in the interlayer dielectric layer through the second hard mask pattern and the first hard mask pattern; providing a filler material on the interlayer dielectric layer and the second hard mask pattern to fill the first trench; exposing an upper portion of the second hard mask pattern by partially removing the filler material; removing the second hard mask pattern; removing remaining filler material from the first trench; and forming a wiring by filling the first trench with a conductive material.

In some embodiments, the second hard mask pattern comprises a metal mask pattern.

In some embodiments, the second hard mask pattern comprises titanium nitride (TiN).

In some embodiments, the removing of the second hard mask pattern comprises selectively removing the second hard mask pattern using wet etching.

In some embodiments, the partially removing the filler material is performed using at least one of a chemical mechanical polishing (CMP) process, an etch-back process, or a combination thereof.

In some embodiments, the providing the substrate comprises providing a substrate including an etch stopper layer formed between the substrate and the interlayer dielectric layer, and a lower dielectric layer formed between the substrate and the etch stopper layer, the lower dielectric layer having a conductive contact formed therein.

In some embodiments, the removing the remaining filler material comprises exposing the etch stopper layer by removing the filler material, and, prior to filling the first trench with the conductive material, there is further provided exposing the conductive contact by removing the etch stopper layer exposed by the first trench.

In some embodiments, the method further comprises, prior to the providing the filler material to fill the first trench, exposing the conductive contact by removing the etch stopper layer exposed by the first trench.

In another aspect, a method for fabricating a semiconductor device comprises: providing a substrate including an interlayer dielectric layer thereon, the substrate including a first region and a second region; sequentially forming a first hard mask pattern and a second hard mask pattern on the interlayer dielectric layer in the first and second regions; providing a first trench in the interlayer dielectric layer in the first region and providing a second trench in the interlayer dielectric layer in the second region using the first hard mask pattern and the second hard mask pattern as etch masks; filling the first trench and the second trench by providing a filler material on the interlayer dielectric layer and the second hard mask pattern in the first and second regions; exposing an upper portion of the second hard mask pattern by partially removing the filler material; removing the second hard mask pattern; removing remaining filler material from the first trench and the second trench; and forming a wiring by filling the first french and the second trench with a conductive material.

In some embodiments, after the providing of the first trench and the second trench, the first hard mask pattern in the first region has a first thickness, and the second hard mask pattern in the second region has a second thickness, wherein the first thickness is different than the second thickness.

In some embodiments, the second hard mask pattern comprises a metal mask pattern.

In some embodiments, the removing the second hard mask pattern comprises selectively removing the second hard mask pattern using wet etching.

In some embodiments, the providing the substrate comprises providing a substrate including an etch stopper layer between the substrate and the interlayer dielectric layer, and a lower dielectric layer between the substrate and the etch stopper layer and having a conductive contact formed therein.

In some embodiments, the removing the remaining filler material comprises exposing the etch stopper layer by removing the filler material, and prior to filling the first trench with the conductive material, there is further provided exposing the conductive contact by removing the etch stopper layer exposed by the first trench.

On some embodiments, the method further comprises, prior to the filling the first trench, exposing the conductive contact by removing the etch stopper layer exposed by the first trench.

In another aspect, a method of fabricating a semiconductor device, comprises: providing a first hard mask layer on an interlayer dielectric film and providing a second hard mask layer on the first hard mask layer, the second hard mask layer having etch selectivity relative to the first hard mask layer; forming a trench through the second hard mask layer, the first hard mask layer and the interlayer dielectric film, the trench forming a first opening through the first hard mask layer and the trench forming a second opening through the second hard mask layer, the first opening being larger in area that the second opening; filling the trench with a filler material, the filler material filling the trench in the interlayer dielectric film, and the first and second openings; removing the second hard mask layer; removing filler material from the first trench; and filling the first trench with a conductive material to form an inter-layer wiring.

In some embodiments, filling the first trench further comprises the filler material covering upper portions of the second hard mask layer.

In some embodiments, the method further comprises partially removing the filler material to expose upper portions of the second hard mask layer prior to removing filler material from the first trench.

In some embodiments, the interlayer dielectric film is provided on a substrate and further comprising an etch stopper layer between the substrate and the interlayer dielectric film, wherein the etch stopper layer is selectively removed at a bottom of the first trench prior to filling the first trench with the filler material.

In some embodiments, the interlayer dielectric film is provided on a substrate and further comprising an etch stopper layer between the substrate and the interlayer dielectric film, wherein the etch stopper layer is selectively removed at a bottom of the first trench after removing the filler material from the first trench.

BRIEF DESCRIPTION OF THE DRAWINGS

The above and other features and advantages of the present inventive concepts will become more apparent by describing in detail various embodiments thereof with reference to the attached drawings in which.

DETAILED DESCRIPTION OF EMBODIMENTS

Figure 1:
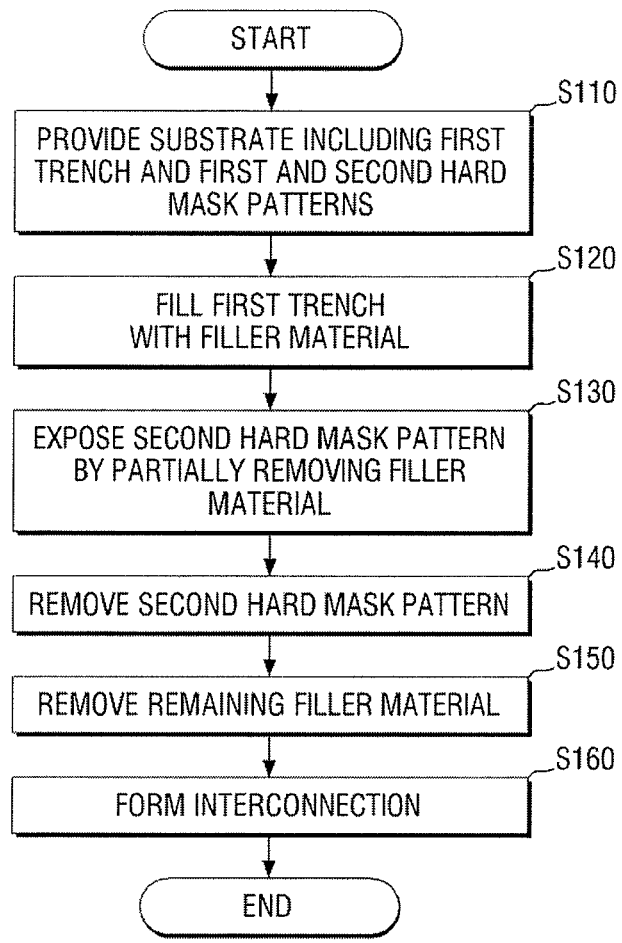
FIG. 1 is a flowchart illustrating a method for fabricating a semiconductor device according to a first embodiment of the present inventive concepts.

Embodiments of the present inventive concepts will now be described more fully hereinafter with reference to the accompanying drawings, in which embodiments are shown. This inventive concepts may, however, be embodied in different forms and should not be construed as limited to the embodiments set forth herein. Like numbers refer to like elements throughout the specification.

It will be understood that, although the terms "first", "second", etc. are used herein to describe various elements, these elements should not be limited by these terms. These terms are used to distinguish one element from another. For example, a "first" element could be termed a "second" element, and, similarly, a "second" element could be termed a "first" element, without departing from the scope of the present inventive concepts. As used herein, the term "and/or" includes any and all combinations of one or more of the associated listed items.

It will be understood that when an element is referred to as being "on" or "connected" or "coupled" to another element, it can be directly on or connected or coupled to the other element or intervening elements can be present. In contrast, when an element is referred to as being "directly on" or "directly connected" or "directly coupled" to another element, there are no intervening elements present. Other words used to describe the relationship between elements should be interpreted in a like fashion (e.g., "between" versus "directly between," "adjacent" versus "directly adjacent," etc.). When an element is referred to herein as being "over" another element, it can be over or under the other element, and either directly coupled to the other element, or intervening elements may be present, or the elements may be spaced apart by a void or gap.

The terminology used herein is for the purpose of describing particular embodiments and is not intended to be limiting of the inventive concepts. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

In the specification, it will be understood that when a layer (or film) is referred to as being 'on' another layer or substrate, it can be directly on the other layer or substrate, or intervening layers may also be present. In the drawings, the dimensions of layers and regions are exaggerated for clarity of illustration. Also, though terms like a first, a second, and a third are used to describe various regions and layers in various embodiments of the present inventive concepts, the regions and the layers are not limited to these terms. These terms are used only to discriminate one region or layer from another region or layer. Therefore, a layer referred to as a first layer in one embodiment can be referred to as a second layer in another embodiment. An embodiment described and exemplified herein includes a complementary embodiment thereof As used herein, the term 'and/or' includes any and all combinations of one or more of the associated listed items. Like reference numerals refer to like elements throughout.

Hereinafter, a method for fabricating a semiconductor device according to a first embodiment of the present inventive concepts will be described with reference to FIGS. 1 to 12. First, a method for fabricating a semiconductor device according to a first embodiment of the present inventive concepts will be described with reference to FIGS. 1 to 12. FIG. 1 is a flowchart illustrating a method for fabricating a semiconductor device according to a first embodiment of the present inventive concept, and FIGS. 2 to 12 are sectional views of intermediate structures for illustrating the method for fabricating a semiconductor device according to the method shown in FIG. 1. Here, FIG. 5A is a sectional view taken along the line A-A' of FIG. 5B.

Referring to FIGS. 1 and 2 to 5B, a substrate 1 is provided, including a first trench 70, a first hard mask pattern 40 and a second hard mask pattern 50 (S110).

Figure 2:
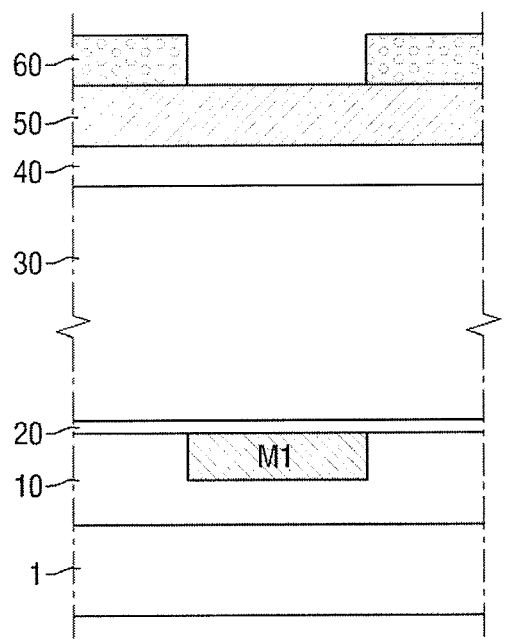
FIGS. 2 to 12 are sectional views of intermediate structures for illustrating the method for fabricating a semiconductor device according to the flow chart of FIG. 1.

More specifically, as shown in FIG. 2, a lower dielectric layer 10 including a wiring M1, an etch stopper layer 20, an interlayer dielectric layer 30, a first hard mask pattern 40, and a second hard mask pattern 50, are sequentially stacked on the substrate 1. A first photoresist pattern 60 for forming a first trench (not shown) may be formed on the second hard mask pattern 50.

Figure 3:
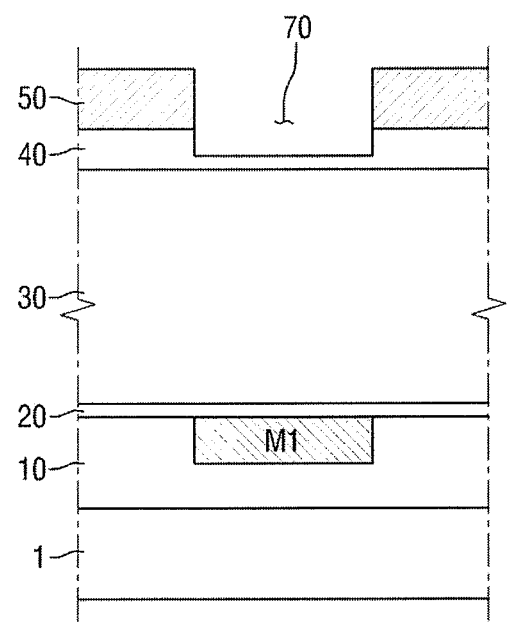

Next, referring to FIG. 3, the first trench 70 may be formed in the first and second hard mask patterns 40 and 50 using the first photoresist pattern 60 as an etch mask. In the present example embodiment, the first trench is formed through the second hard mask pattern 50 and partially through the first hard mask pattern 40. Other variations are possible and within the scope of the present inventive concepts.

Figure 4:
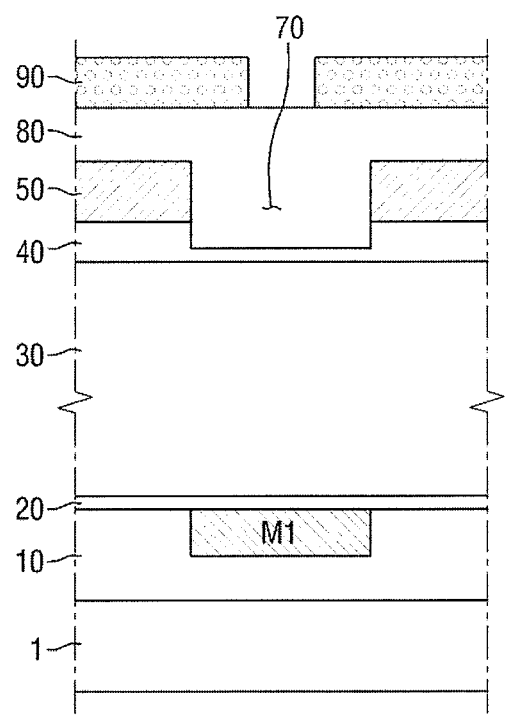
Figure 5A:
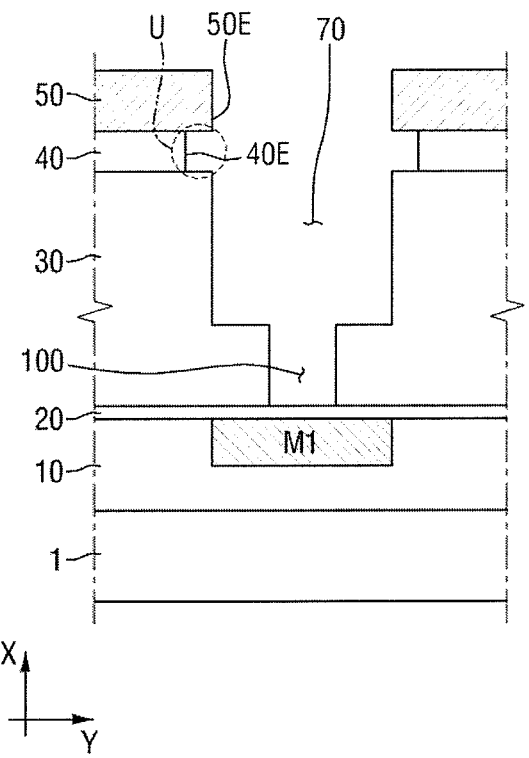

Referring to FIG. 4, an etch layer 80 may be formed on the first and second hard mask patterns 40 and 50 to fill the first trench 70, and a second photoresist pattern 90 having an opening to be used for forming a first via hole (not shown) on the etch layer 80.

Figure 5B:
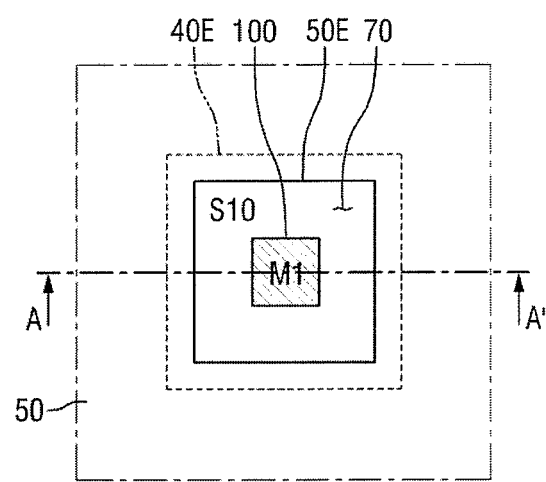
Figure 6:
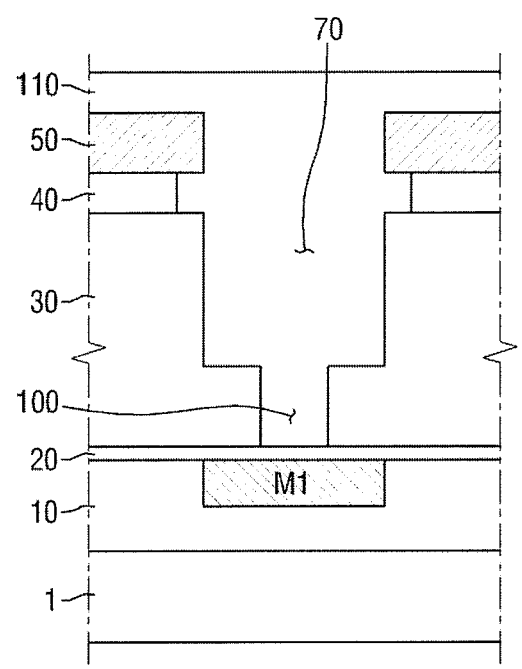

Referring to FIGS. 4, 5A and 5B, the etch layer 80, the first hard mask pattern 40 and the interlayer dielectric layer 30 may be partially etched using the second photoresist pattern 90 as an etch mask. This forms an initial, relatively narrow trench in the interlayer dielectric layer 30. Next, the second photoresist pattern 90 and the etch layer 80 may be removed, and the interlayer dielectric layer 30 may be etched using the second hard mask pattern 50 as an etch mask. As a result, a first via hole 100 is formed through a lower portion of the ILD film 30 and the etch stopper layer 20. The upper portion of the first via hole 100 communicates with the first trench 70 which is formed through the upper portion of the ILD layer 30. The first trench 70 is relatively wider in dimension than the first via hole 100.

Referring to FIGS. 5A and 5B, the resulting semiconductor device may thus include a first via hole 100 and a first trench 70 formed in the interlayer dielectric layer 30, and first and second hard mask patterns 40 and 50 sequentially stacked on the interlayer dielectric layer 30 while exposing the first trench 70. In embodiments of the present inventive concept, a via hole may be formed to extend to a lower wiring. However, in some embodiments of the present inventive concept, a via hole may not be formed.

Here, the filler material 110 may comprise a material having suitable gap-filling characteristics and relatively high planarity. In cases where the filler material 110 has suitable gap-filling characteristics, the first trench 70 and the first via hole 100 can be stably filled. In some embodiments, the filler material 110 may comprise a carbon-based material. Alternatively, the filler material 110 may comprise a spin-on-hardmask (SOH), a nitride floating cap (NFC), a $SiO_2$ based material, a spin-on-coating based material, an inorganic spin-on-coating based material, and the like.

Figure 7:
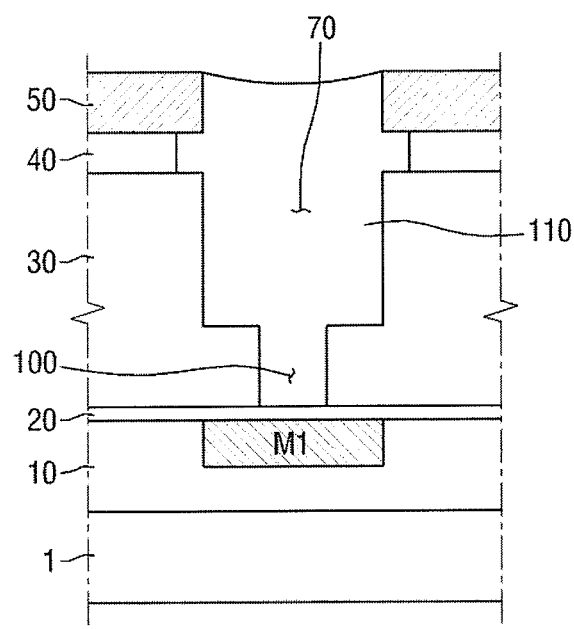

Next, referring to FIGS. 1 and 7, the second hard mask pattern 50 is exposed by partially removing the filler material 110 (S130).

In further detail, the filler material 110 on the second hard mask pattern 50 may be removed until the second hard mask pattern 50 is exposed. Here, in some embodiments, the removal of the filler material 110 may be performed using at least one of a chemical mechanical polishing (CMP) process and an etch-back process or a combination thereof. That is to say, the filler material 110 may be removed using a CMP process or an etch-back process until the second hard mask pattern 50 is exposed. Alternatively, the filler material 110 may be partially removed by CMP and then further removed until the second hard mask pattern 50 is exposed.

Figure 8:
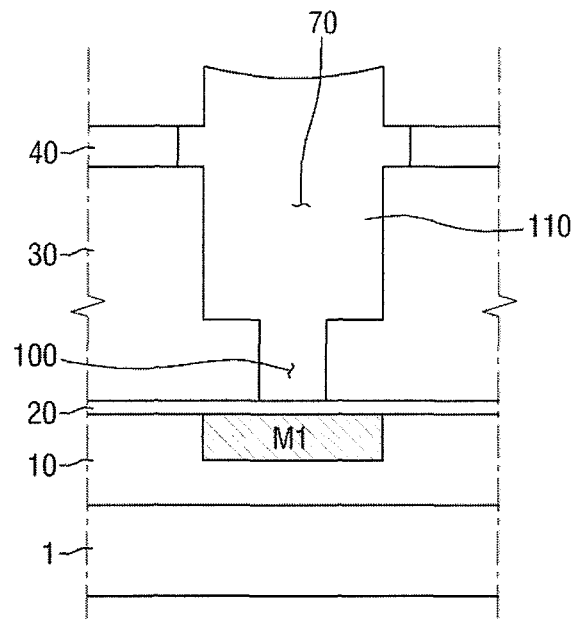

Next, referring to FIGS. 1 and 8, the second hard mask pattern 50 is removed (S140).

In some embodiments, the second hard mask pattern 50 may comprise, for example, a metal mask pattern. The second hard mask pattern 50 may comprise, for example, a material including TiN. Further, the removing of the second hard mask pattern 50 may include selectively removing the second hard mask pattern 50 by wet etching.

In further detail, the second hard mask pattern 50 may be selectively removed using an etching solution having high etching selectivity of the second hard mask pattern 50 with respect to the first hard mask pattern 40 and the filler material 110. In a case where the second hard mask pattern 50 is formed of a material including TiN, examples of embodiments of the etching solution may include SC1, a mixed solution of tetraethylammonium hydroxide (TEAH) and $H_2O_2$, and a mixed solution of tetramethylammonium hydroxide (TMAH) and $H_2O_2$.

As described above, in the forming of the first trench 70 and the first via hole 100, the first hard mask pattern 40 may become over-etched in the horizontal direction, as compared to the second hard mask pattern 50. Such over-etching of the first hard mask pattern 40 may form an undercut U feature, as shown in FIG. 5a. In this case, an inner end 50E of the second hard mask pattern 50, as shown in FIG. 5A, protrudes further in the horizontal direction in a direction toward the first trench 70 than an inner end 40E of the first hard mask pattern 40. As described above, since the second hard mask pattern 50 is formed so as not to expose the inner end 40E of the first hard mask pattern 40, the sidewalls of the first hard mask pattern 40 and the second hard mask pattern 50 may collectively be considered to have a negative slope. Also, a first opening in the first hard mask pattern 40 can be considered to have an area that is greater than an area of the second opening in the second hard mask pattern, as a result of the overetching.

Returning to FIG. 8, as a result of the removing of the second hard mask pattern 50, the resulting geometry of the negative slopes of the sidewalls of the first hard mask pattern 40 and the second hard mask pattern 50 may be eliminated. Accordingly, it is possible to prevent a pile-up phenomenon in which deposition materials can become collected on such negatively sloped structures during subsequent deposition process. As a result, an improved semiconductor device having greater reliability and improved yield can be fabricated.

Further, with increased integration, as the device design rule becomes further reduced, it is desired to form a trench and a via hole having improved profiles. To accomplish this, the thickness of the second hard mask pattern 50 may be increased. After the trench and the via hole are formed, the second hard mask pattern 50 is removed, thereby relatively reducing an aspect ratio of the trench or the via hole. The relatively reduced aspect ratio allows the trench and the via hole to be filled more reliably in a subsequent deposition process.

In addition, while the etching process is performed to remove the second hard mask pattern 50, the filler material 110 remains in the first trench 70 and the first via hole 100. Accordingly, it is possible to prevent a lower structure, for example, the interlayer dielectric layer 30, the etch stopper layer 20 and the wiring M1, from becoming damaged by the etching process.

Figure 9:
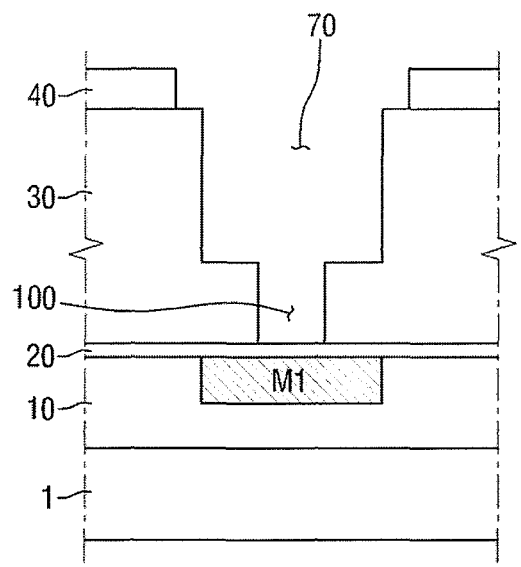

Next, referring to FIGS. 1 and 9, the remaining filler material 110 is removed (S150).

The filler material 110 may be selectively removed by performing, for example, an ashing process. Alternatively, the filler material 110 may be selectively removed by a wet etching process using an etching solution having high etching selectivity of the second hard mask pattern 50 with respect to the first hard mask pattern 40, the interlayer dielectric layer 30 and the etch stopper layer 20. As shown, the etch stopper layer 20 may be exposed by removing the remaining filler material 110.

Referring to FIGS. 1 and 10 to 12, a wiring is formed (S160).

Figure 10:
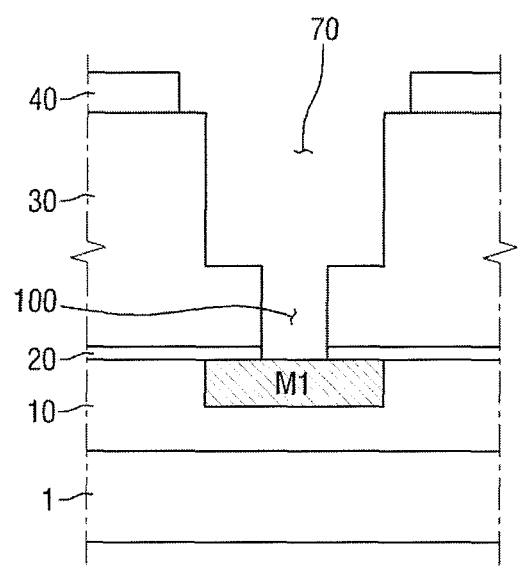

In more detail, as shown in FIG. 10, the etch stopper layer 20 exposed by the first trench 70 and the first via hole 100 may be selectively removed in the bottom of the first via hole 100. As shown, a wiring M1 included in the lower dielectric layer 10 may be exposed by removing the etch stopper layer 20. In various embodiments, the etch stopper layer 20 may comprise, for example, a nitride layer. In various embodiments, the removing of the etch stopper layer 20 may include performing a wet etching process or a dry etching process.

Figure 11:
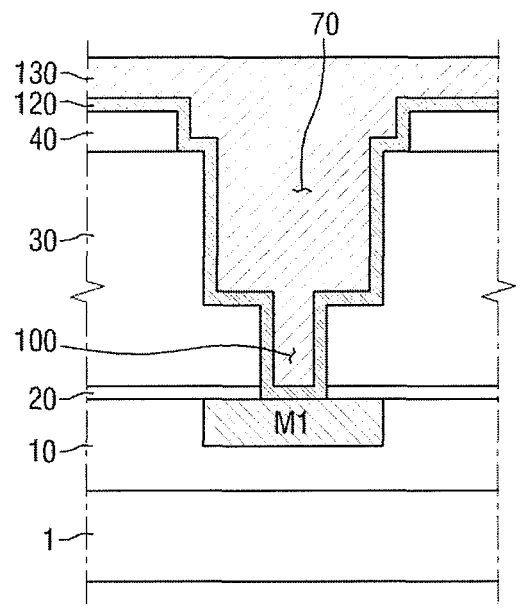

Next, as shown in FIG. 11, a barrier layer 120 and a conductive material 130 may be formed.

In some embodiments, the barrier layer 120 may be formed along inner walls of the first trench 70 and the first via hole 100 and sidewalls and top surface of the first hard mask pattern 40. Here, the barrier layer 120 may be formed by conformally forming the conductive material 130, e.g., TiN/Ta, using a plasma vapor deposition (PVD) process or a chemical vapor deposition (CVD) process, or by another suitable formation technique.

The conductive material 130 may be formed on the barrier layer 120 to fill the first trench 70. Here, the conductive material 130 may be formed to fill the first trench 70 and the first via hole 100. In some embodiments, the conductive material 130 may include, for example, copper (Cu), and may be formed to fill the first via hole 100 and the first trench 70 by, for example, plating.

Figure 12:
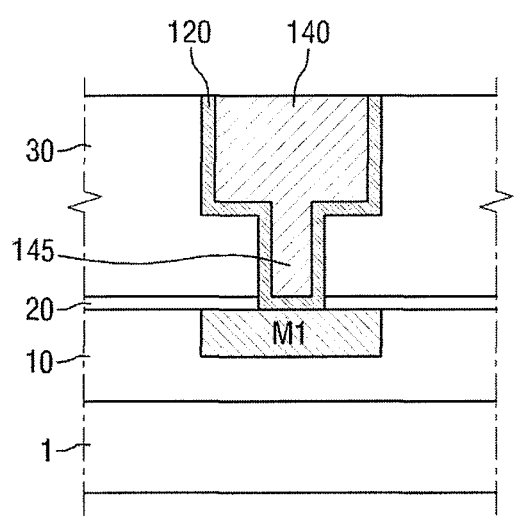

As shown in FIG. 12, a planarization process may be performed to expose a top surface of the interlayer dielectric layer 30.

In detail, the first hard mask pattern 40 may be removed by, for example, chemical mechanical polishing (CMP), thereby forming a first damascene wiring 140 including a first via 145 while exposing the top surface of the interlayer dielectric layer 30.

Figure 13:
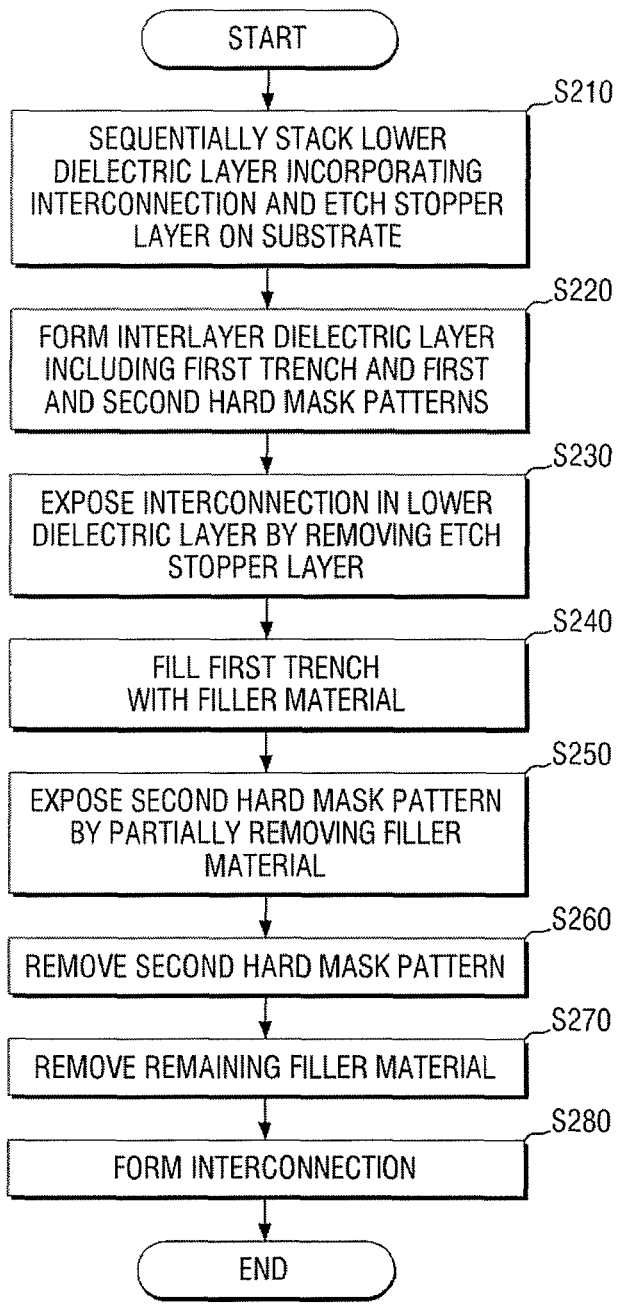
FIG. 13 is a flowchart illustrating a method for fabricating a semiconductor device according to a second embodiment of the present inventive concepts.

Hereinafter, a method for fabricating a semiconductor device according to a second embodiment of the present inventive concepts will be described with reference to FIGS. 13 and 14 to 18. FIG. 13 is a flowchart illustrating a method for fabricating a semiconductor device according to a second embodiment of the present inventive concept, and FIGS. 14 to 18 are sectional views of intermediate structures for illustrating the method for fabricating a semiconductor device according to the method shown in FIG. 13.

The method for fabricating the semiconductor device according to the second embodiment of the present inventive concept is different from that according to the first embodiment in that before forming a first trench and a first via hole and filling a filler material, an etch stopper layer is removed. For brevity of description, the same components as those of the above embodiment will not be described in detail, or will be briefly described.

First, referring to FIGS. 13 and 2 to 5B, a lower dielectric layer 10 including a wiring M1, and an etch stopper layer 20 are sequentially stacked on a substrate 1 (S210). An interlayer dielectric layer 30 including a first trench 70, a first hard mask pattern 40 and a second hard mask pattern 50 are formed (S220). The method for forming the first trench 70 and the first via hole 100 using the first hard mask pattern 40 and the second hard mask pattern 50 is substantially the same as that of the previous embodiment, and a detailed description thereof will be omitted.

Figure 14:
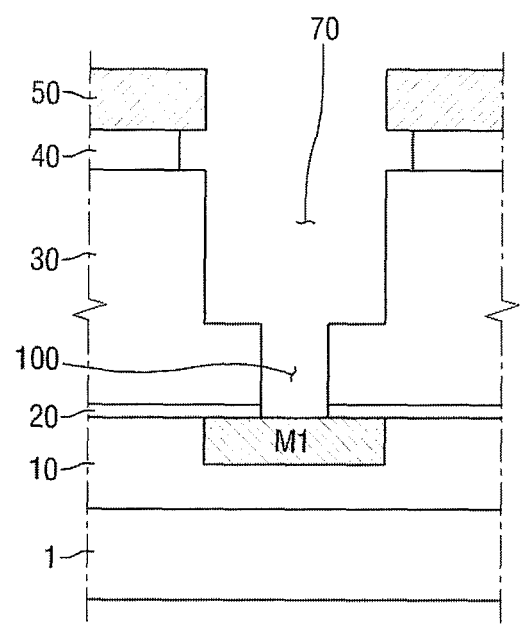
FIGS. 14 to 18 are sectional views of intermediate structures for illustrating the method for fabricating a semiconductor device according to the flow chart of FIG. 13.

Referring to FIGS. 13 and 14, the wiring M1 included in the lower dielectric layer 10 is exposed by removing the etch stopper layer 20 (S230). In further detail, the etch stopper layer 20 exposed by the first trench 70 and the first via hole 100 may be selectively removed, and the wiring M1 included in the lower dielectric layer 10 may thereby be exposed. In some embodiments, the etch stopper layer 20 may comprise, for example, a nitride layer. In some embodiments, the removing of the etch stopper layer 20 may include selectively removing the etch stopper layer 20 by a wet etching process or a dry etching process or by some other suitable removal process.

Figure 15:
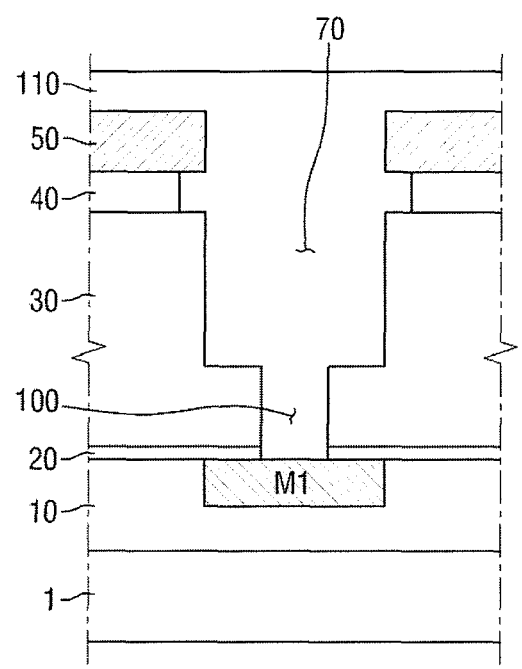

Referring to FIGS. 13 and 15, the first trench 70 is filled with a filler material 110 (S240). In more detail, the filler material 110 is formed on the interlayer dielectric layer 30 and the second hard mask pattern 50 to fill the first trench 70 and the first via hole 100. In some embodiments, the filler material 110 may comprise a material having a suitable gap-filling characteristics and high planarity. For example, in some embodiments, the filler material 110 may comprise a carbon-based material. Alternatively, in some embodiments, the filler material 110 may comprise a spin-on-hardmask (SOH), nitride floating cap (NFC), a deep ultraviolet light absorbing oxide (DUO) material, or other suitable material.

Figure 16:
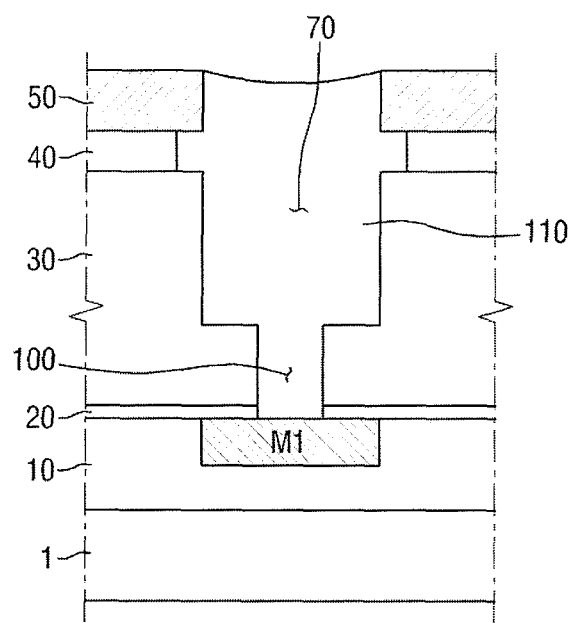

Next, referring to FIGS. 13 and 16, the second hard mask pattern 50 is exposed by partially removing an upper portion of the filler material 110 (S250). In more detail, the filler material 110 on the second hard mask pattern 50 may be removed using at least one of a chemical mechanical polishing (CMP) process and an etch-back process or a combination thereof until the second hard mask pattern 50 is exposed.

Figure 17:
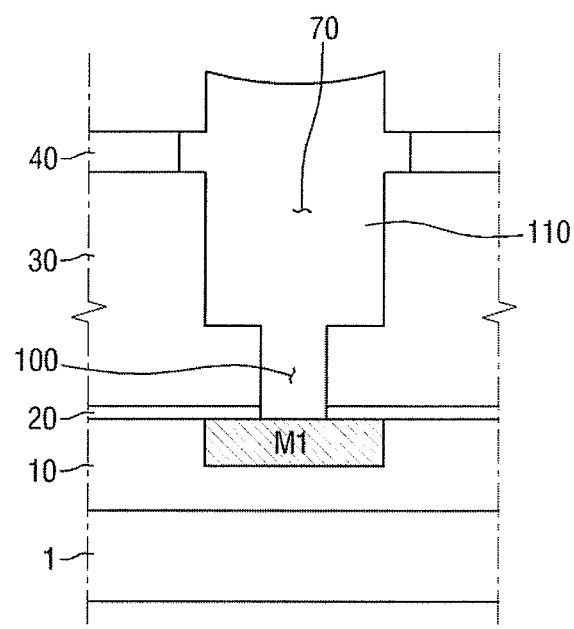

Next, referring to FIGS. 13 and 17, the second hard mask pattern 50 is removed (S260). In more detail, the second hard mask pattern 50 may be selectively removed by wet etching. In an embodiment where the second hard mask pattern 50 is formed of a material including TiN, examples of the etching solution may include SC1, a mixed solution of tetraethylammonium hydroxide (TEAH) and $H_2O_2$, and a mixed solution of tetramethylammonium hydroxide (TMAH) and $H_2O_2$.

As a result of the removing of the second hard mask pattern 50, the resulting geometry of the negative slopes of the sidewalls of the first hard mask pattern 40 and the second hard mask pattern 50 may be eliminated. Accordingly, it is possible to prevent a pile-up phenomenon in which deposition materials can become collected on such negatively sloped structures during subsequent deposition processes. As a result, an improved semiconductor device having greater reliability and improved yield can be fabricated.

Further, with increased integration, as the device design rule becomes further reduced, it is desired to form a trench and a via hole having improved profiles. To accomplish this, the thickness of the second hard mask pattern 50 may be increased. After the trench and the via hole are formed, the second hard mask pattern 50 is removed, thereby relatively reducing an aspect ratio of the trench or the via hole. The relatively reduced aspect ratio allows the trench and the via hole to be filled more reliably in a subsequent deposition process.

In addition, while the etching process is performed to remove the second hard mask pattern 50, the filler material 110 remains in the first trench 70 and the first via hole 100. Accordingly, it is possible to prevent a lower structure, for example, the interlayer dielectric layer 30, the etch stopper layer 20 and the wiring M1, from becoming damaged by the etching process.

Figure 18:
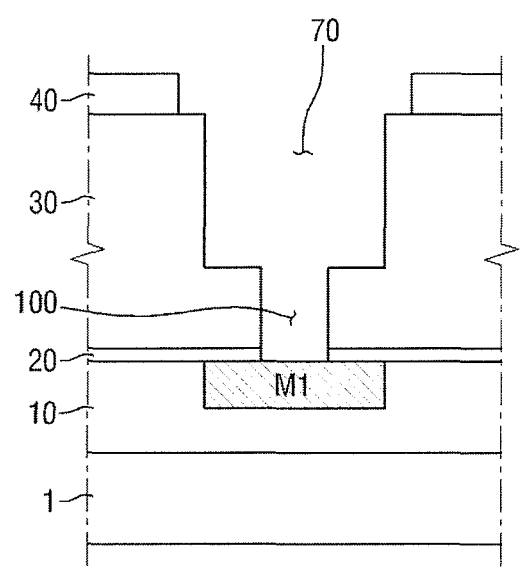

Next, referring to FIGS. 13 and 18, the remaining filler material 110 is removed (S270).

The filler material 110 may be selectively etched by performing, for example, an ashing process. Alternatively, as described above, the filler material 110 may be selectively removed by a wet etching process using an etching solution having high etching selectivity with respect to the first hard mask pattern 40 and the interlayer dielectric layer 30. As shown, the lower wiring M1 may be exposed by removing the filler material 110.

Referring to FIGS. 11 and 12, a wiring is formed (S280).

Next, a barrier layer 120 and a conductive material 130 may be formed and then planarized to expose a top surface of the interlayer dielectric layer 30, thereby forming a first damascene wiring 140 including a first via 145, in a manner that is similar to that described above in connection with the previous embodiment.

Figure 19:
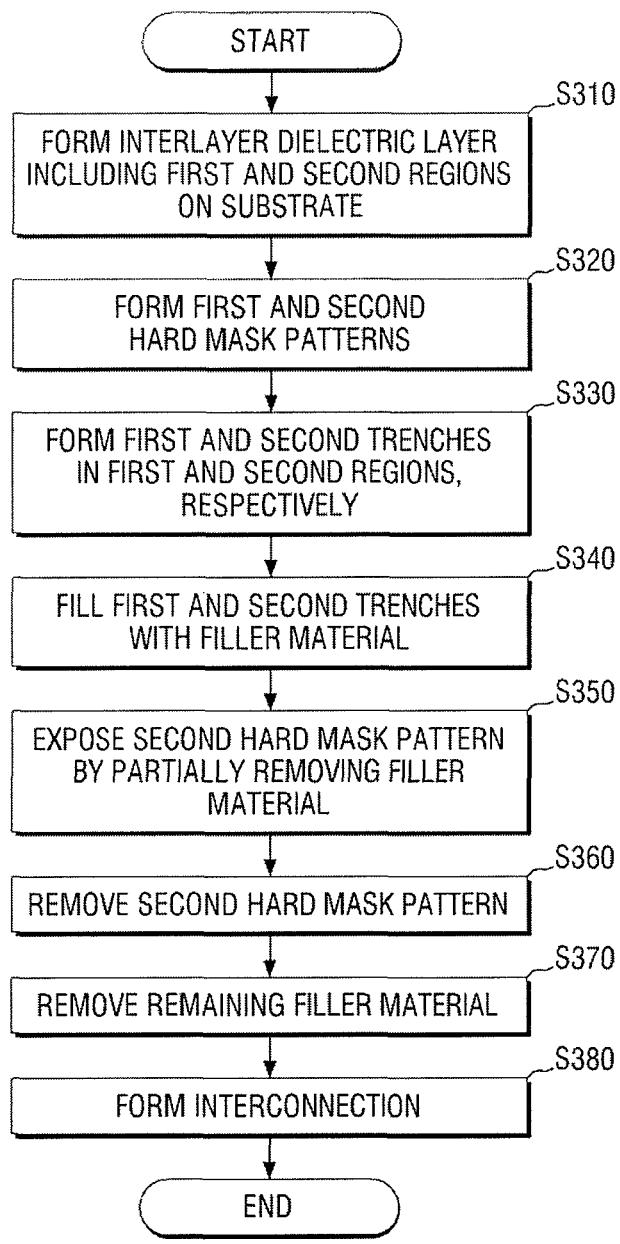
FIG. 19 is a flowchart illustrating a method for fabricating a semiconductor device according to a third embodiment of the present inventive concepts.

Hereinafter, a method for fabricating a semiconductor device according to a second embodiment of the present inventive concept will be described with reference to FIGS. 19 and 20 to 30. FIG. 19 is a flowchart illustrating a method for fabricating a semiconductor device according to a third embodiment of the present inventive concept, and FIGS. 20 to 30 are sectional views of intermediate structures for illustrating the method for fabricating a semiconductor device according to the flowchart of FIG. 19.

Figure 20:
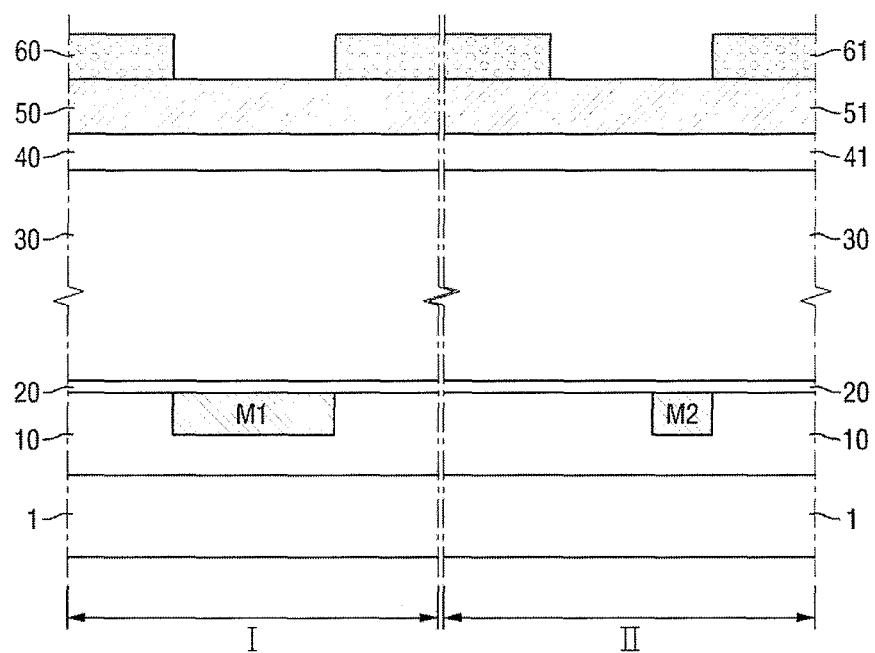
FIGS. 20 to 30 are sectional views of intermediate structures for illustrating the method for fabricating a semiconductor device according to the flow chart of FIG. 19.

First, referring to FIGS. 19 and 20, an interlayer dielectric layer 30 including a first region I and a second region II is formed on a substrate 1 (S310), and first hard mask patterns 40 and 41 and second hard mask patterns 50 and 51 are formed (S320).

In more detail, as shown in FIG. 20, a lower dielectric layer 10 including a first wiring M1 and a second wiring M2, an etch stopper layer 20, the first hard mask patterns 40 and 41 and the second hard mask patterns 50 and 51 are sequentially stacked on the substrate 1. Further, first photoresist patterns 60 and 61 for forming a first trench (not shown) and a second trench (not shown) may be formed on the second hard mask patterns 50 and 51.

Next, referring to FIGS. 19 and 21 to 23B, a first trench 70 and a second trench 71 are formed in the first region I and the second region II, respectively (S330).

Figure 21:
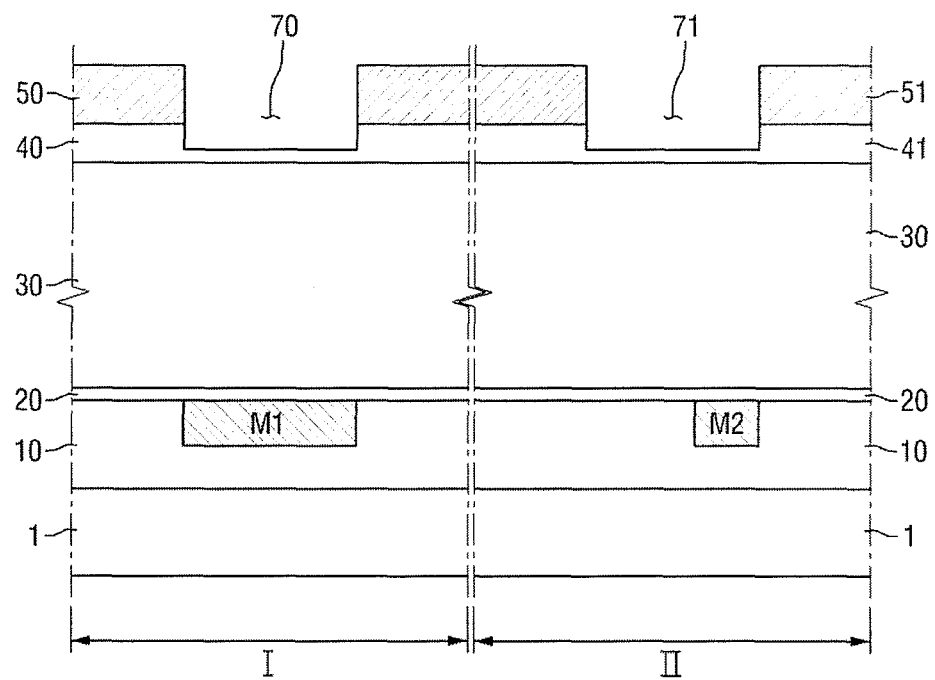

First, as shown in FIGS. 19 and 21, the first trench 70 and the second trench 71 may be formed in the first and second hard mask patterns 40, 41, 50 and 51, respectively, using the first photoresist patterns 60 and 61 as etch masks.

Figure 22:
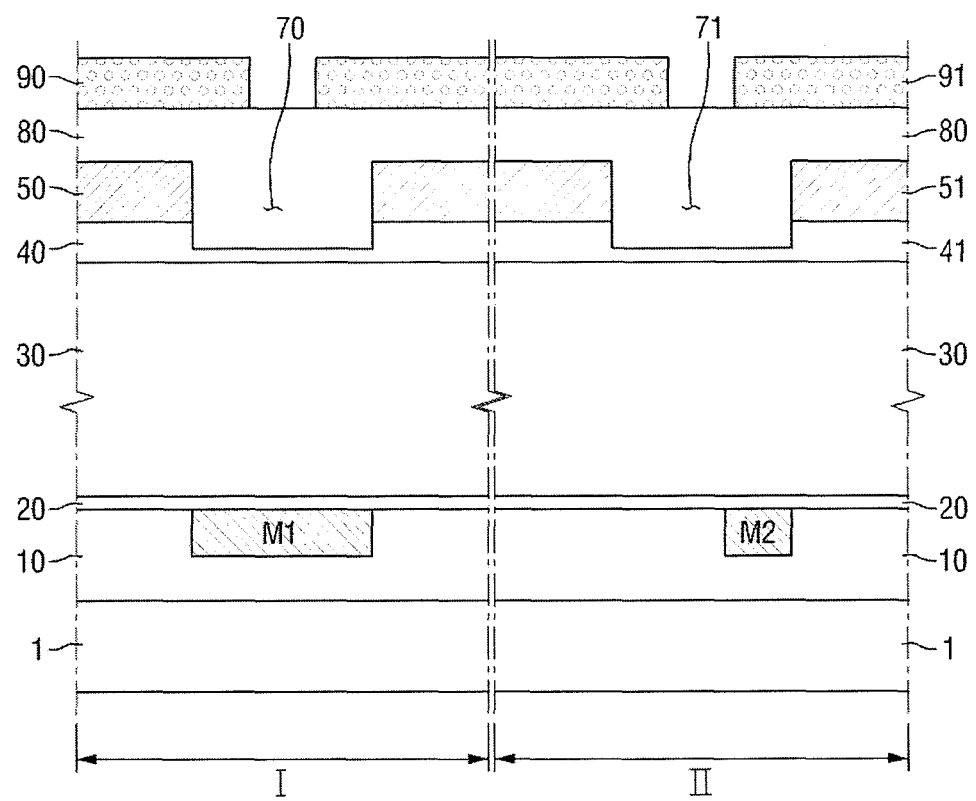

Next, as shown in FIG. 22, an etch layer 80 is formed on the first and second hard mask patterns 40, 41, 50 and 51 to fill the first and second trenches 70 and 71, and second photoresist patterns 90 and 91 for forming first and second via holes (not shown) may be formed.

Figure 23B:
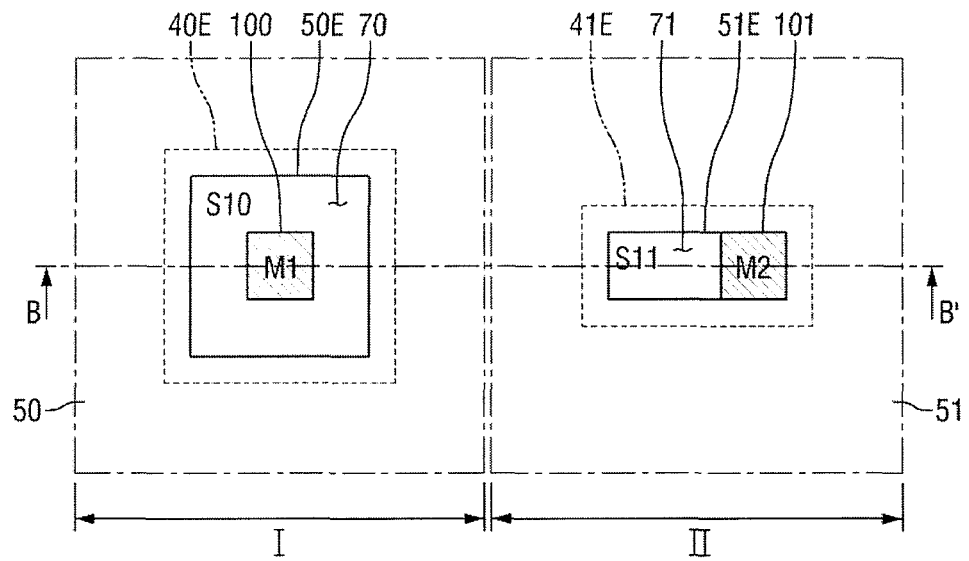

Referring to FIGS. 23A and 23B, the first region I and the second region II of the etch layer 80, the first hard mask patterns 40 and 41 and the interlayer dielectric layer 30 may be partially etched using the second photoresist patterns 90 and 91 as etch masks. Next, the second photoresist patterns 90 and 91 and the etch layer 80 are removed, and the first region I and the second region II of the interlayer dielectric layer 30 are etched using the second hard mask patterns 50 and 51 as etch masks.

As shown, first and second via holes 100 and 101 and the first and second trenches 70 and 71 may be formed in the first region I and the second region II of the interlayer dielectric layer 30, respectively, and the first and second trenches 70 and 71 in the interlayer dielectric layer 30 may be exposed on the interlayer dielectric layer 30. The first hard mask patterns 40 and 41 and the second hard mask patterns 50 and 51 sequentially stacked may be formed.

Here, a height H1 of the second hard mask pattern 50 in the first region I and a height H2 of the second hard mask pattern 50 in the second region II may be different from each other according to various parameters, including the relative position of the formed via hole, densities of adjacent trenches and etching conditions. While the height H1 of the second hard mask pattern 50 in the first region I is greater than the height H2 of the second hard mask pattern 50 in the second region II in the illustrated embodiment, the height H1 may alternatively be smaller than the height H2.

Sidewalls of the first and second hard mask patterns 40 and 50 in the first region I and sidewalls of the first and second hard mask patterns 41 and 51 in the second region II may have a negative slope, respectively, as described herein. Referring to FIG. 23B, a top surface of the first trench 70 formed in the first region I may have a first area S10 and a top surface of the second trench 71 formed in the second region II may have a third area S11, in a manner similar to that described herein in detail, and repeated descriptions thereof will be omitted.

Figure 24:
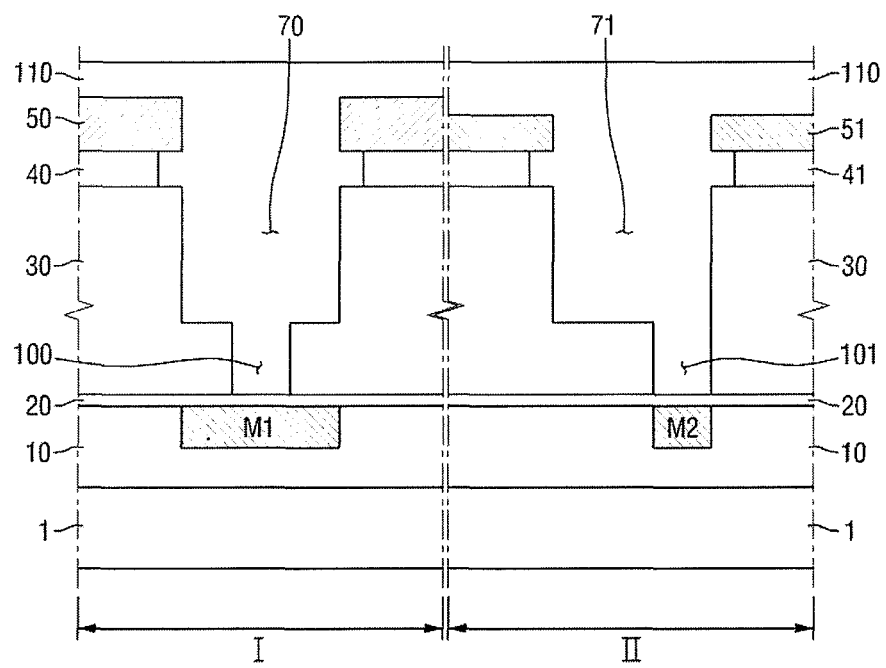

Next, referring to FIGS. 19 and 24, the first and second trenches 70 and 71 are filled with a filler material 110 (S340).

In more detail, the filler material 110 may be formed on the first and second regions I and II of the interlayer dielectric layer 30 and the first and second hard mask patterns 40, 41, 50 and 51 to fill the first and second trenches 70 and 71. Here, the filler material 110 may fill the first and second trenches 70 and 71, respectively. As described above, the filler material 110 may be a material having a good gap-filling characteristic and high planarity. For example, the filler material 110 may be a carbon-based material. Alternatively, the filler material 110 may include a spin-on-hardmask (SOH), nitride floating cap (NFC), a deep ultraviolet light absorbing oxide (DUO) material, and the like.

Figure 25:
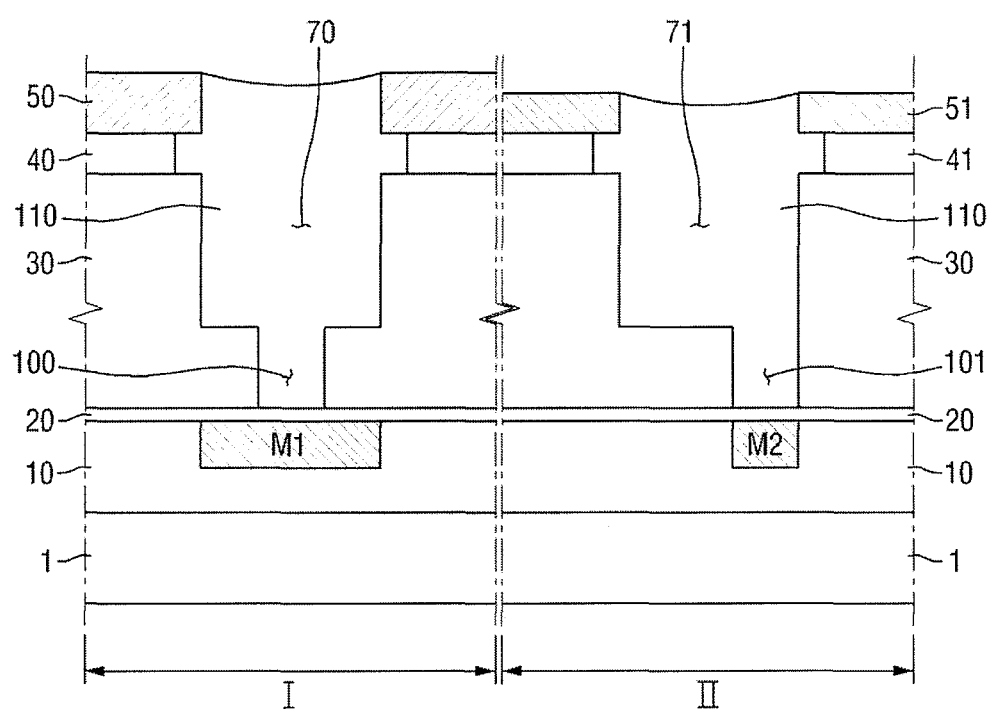

Next, referring to FIGS. 19 and 25, the second hard mask patterns 50 and 51 are exposed by partially removing the filler material 110 (S350). In the same manner, the filler material 110 on the second hard mask patterns 50 and 51 may be removed until the second hard mask patterns 50 and 51 are exposed. In various embodiments, the removing of the filler material 110 may be performed using at least one of a chemical mechanical polishing (CMP) process and an etch-back process or a combination thereof, or other suitable material removal process.

Figure 26:
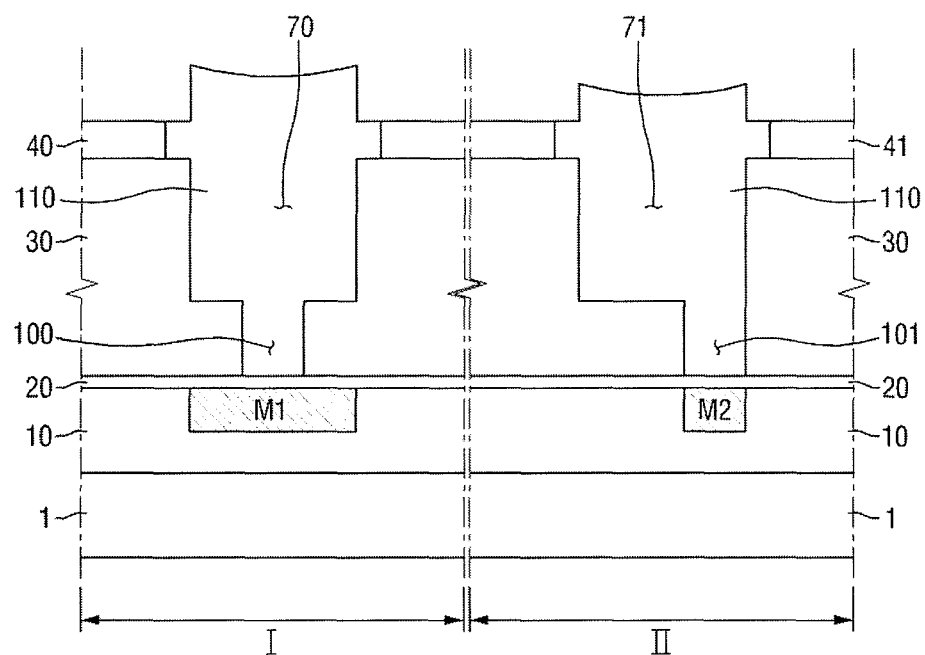

Next, referring to FIGS. 19 and 26, the second hard mask patterns 50 and 51 are removed (S360). In more detail, the second hard mask patterns 50 and 51 may be selectively removed by wet etching. In a case where the second hard mask patterns 50 and 51 are formed of a material including TiN, examples of the etching solution may include SC1, a mixed solution of tetraethylammonium hydroxide (TEAH) and $H_2O_2$, and a mixed solution of tetramethylammonium hydroxide (TMAH) and $H_2O_2$.

As described above, referring to FIG. 23a, a height H1 of the second hard mask pattern 50 in the first region I may be different from a height H2 of the second hard mask patterns 50 and 51 in the second region II. Thus, as a result of removing of the second hard mask patterns 50 and 51 having different heights in the first and second regions I and II, the resulting depths of the first trench 70 in the first region I and the second trench 71 in the second region II may be made to be equal to each other. Accordingly, in subsequent fabrication processes including the filling the first trench 70 and the second trench 71, the top surface of the filler material can become relatively planarized, thereby mitigating reliability issues in the resulting semiconductor device.

Further, the negative slopes of the sidewalls of the first hard mask patterns 40 and 41 and the second hard mask patterns 50 and 51 may be removed by removing the second hard mask patterns 50 and 51. Accordingly, it is possible to prevent a pile-up phenomenon in which deposition materials can become collected on such negatively sloped structures during subsequent deposition process. As a result, an improved semiconductor device having greater reliability and improved yield can be fabricated.

In addition, in order to stably form a trench and a via hole having improved profiles, the thicknesses of the second hard mask patterns 50 and 51 may be increased. Irrespective of this, after the trench and the via hole are formed, the second hard mask patterns 50 and 51 are removed, thereby reducing an aspect ratio of the trench or the via hole. The reduced aspect ratio allows the trench and the via hole to be filled more stably during a subsequent process of filling the trench and the via hole with a conductive material, thereby allowing for the fabrication of a semiconductor device having improved reliability and improved yield.

In addition, as shown, while the etching process is performed for removing the second hard mask patterns 50 and 51, the protective filler material 110 remains in the first and second trenches 70 and 71 and the first and second via holes 100 and 101. Accordingly, it is possible to prevent the interlayer dielectric layer 30, the etch stopper layer 20, and the lower wirings M1 and M2 from becoming damaged during the etching process of the second hard mask patterns 50 and 51; in other words, the etching process may be stably performed.

Figure 27:
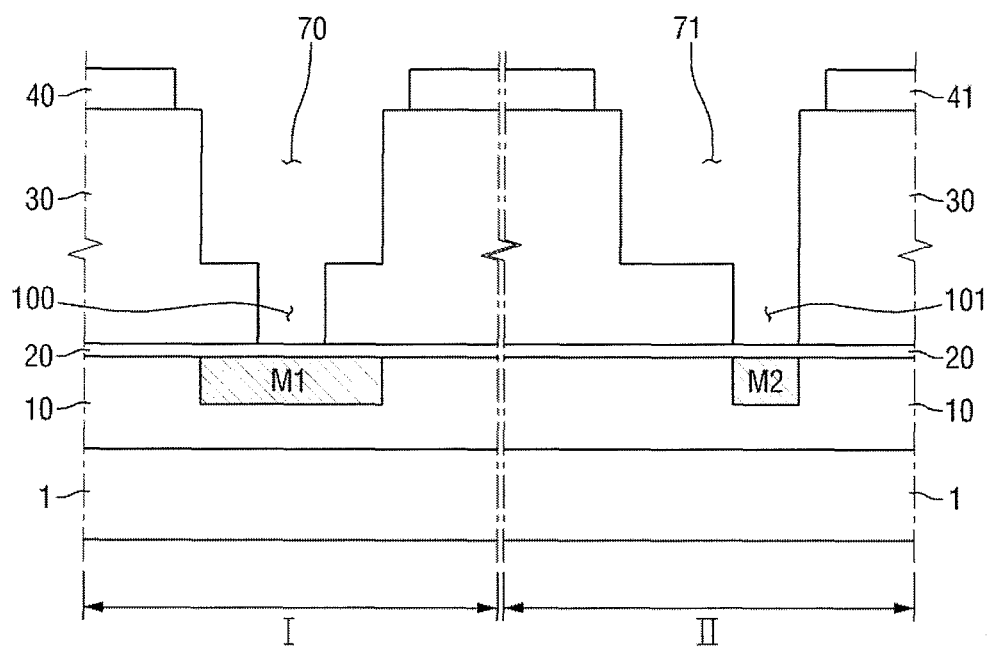

Next, referring to FIGS. 19 and 27, the remaining filler material 110 is removed (S370).

Any residual filler material 110 remaining in the first and second trenches 70 and 71 may be selectively etched by performing, for example, an ashing process. Alternatively, the filler material 110 may be selectively removed by a wet etching process using an etching solution having high etching selectivity with respect to the first hard mask patterns 40 and 41, the interlayer dielectric layer 30 and the etch stopper layer 20. As shown, the etch stopper layer 20 may be exposed by removing the filler material 110.

Referring to FIGS. 19 and 28 to 30, a damascene wiring is formed (S380).

Figure 28:
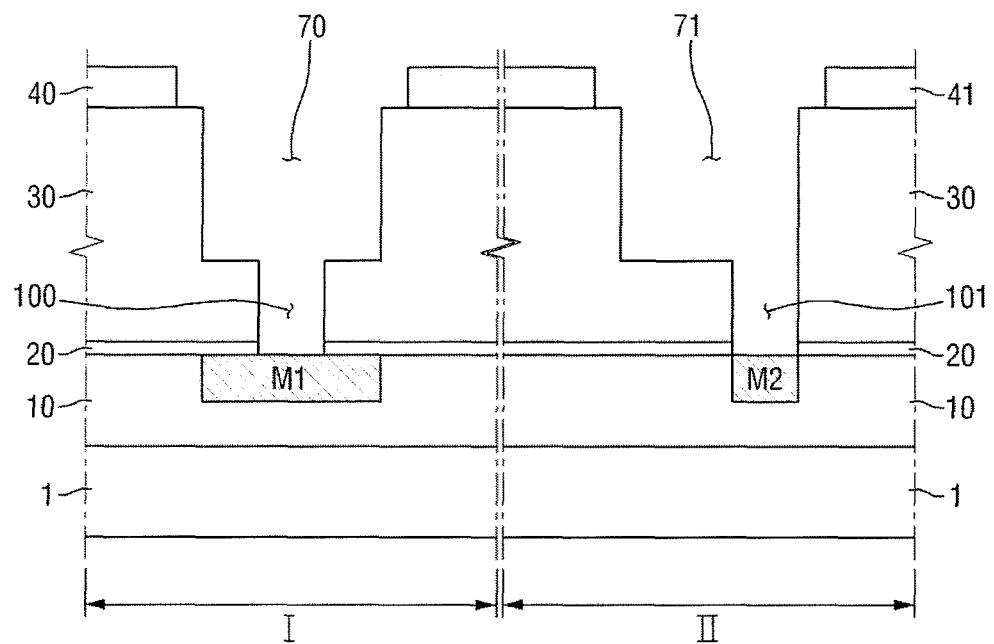

In more detail, as shown in FIG. 28, the etch stopper layer 20 exposed by the first trench 70 and the first via hole 100 formed in the first region I and the second trench 71 and the second via hole 101 in the second region II may be selectively removed. That is to say, the etch stopper layer 20 exposed by the first trench 70 and the first via hole 100 formed in the first region I is selectively removed to expose the first wiring M1 included in the first region I of the lower dielectric layer 10, and the etch stopper layer 20 exposed by the second trench 71 and the second via hole 101 formed in the second region II is selectively removed to expose the second wiring M2 included in the second region II of the lower dielectric layer 10. For example, the process of removing of the etch stopper layer 20 may include performing a wet etching process or a dry etching process.

Figure 29:
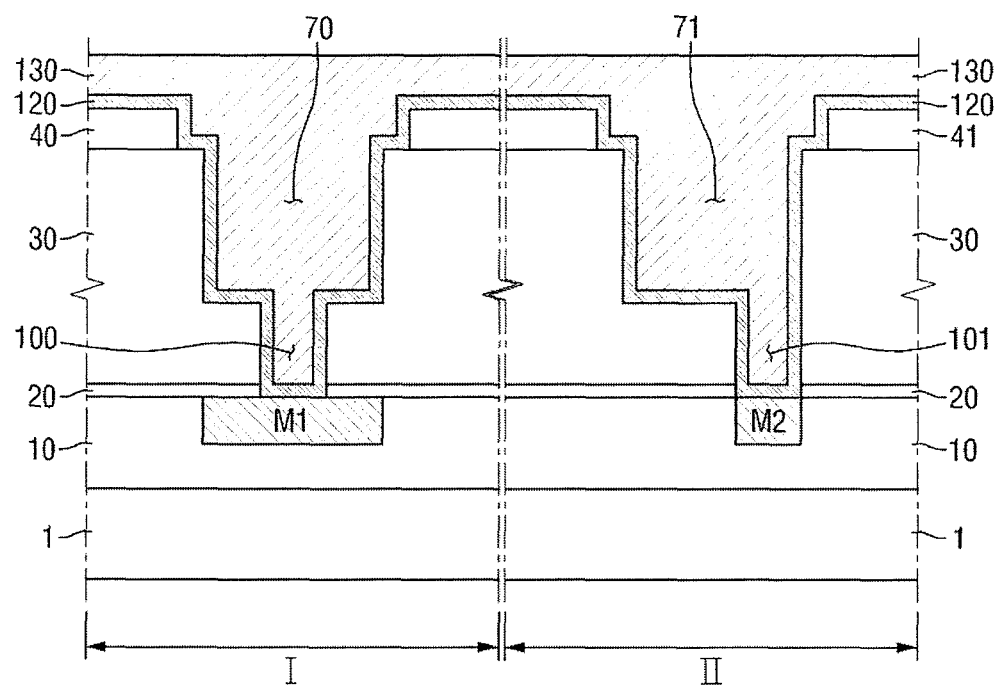

Next, as shown in FIG. 29, a barrier layer 120 may be formed along sidewalls and bottom surfaces of the first and second trenches 70 and 71, sidewalls and bottom surfaces of the first and second via holes 100 and 101, and sidewalls and top surfaces of the first hard mask patterns 40 and 41, and a conductive material 130 may be formed on the barrier layer 120 to fill the first and second trenches 70 and 71 and the first and second via holes 100 and 101.

Figure 30:
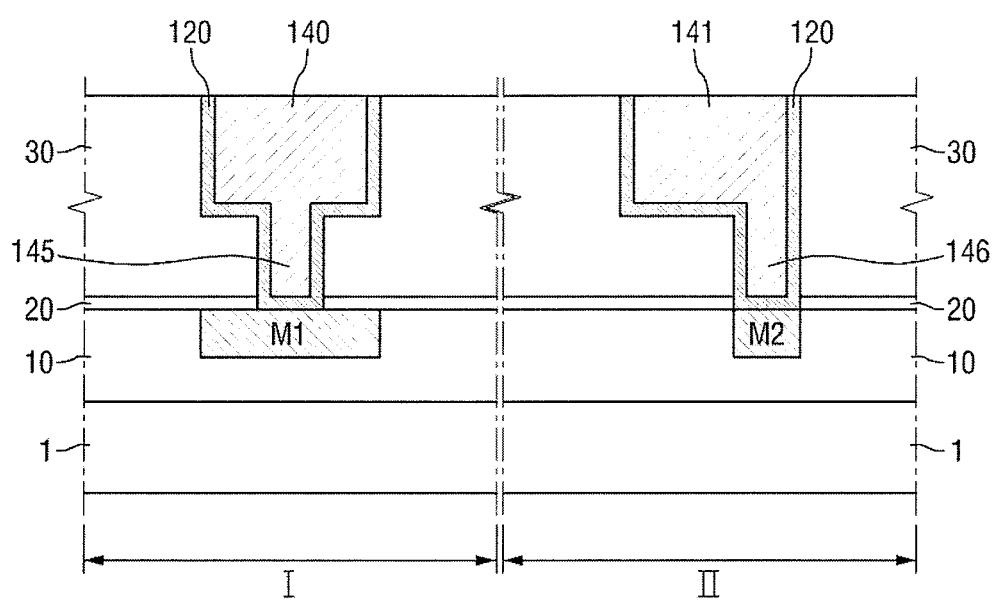

As shown in FIG. 30, a planarization process may be performed to expose top surfaces of the first and second regions I and II of the interlayer dielectric layer 30, thereby removing the first hard mask patterns 40 and 41 and forming a first damascene wiring 140 including a first via 145 and a second damascene wiring 141 including a second via 146.

Figure 31:
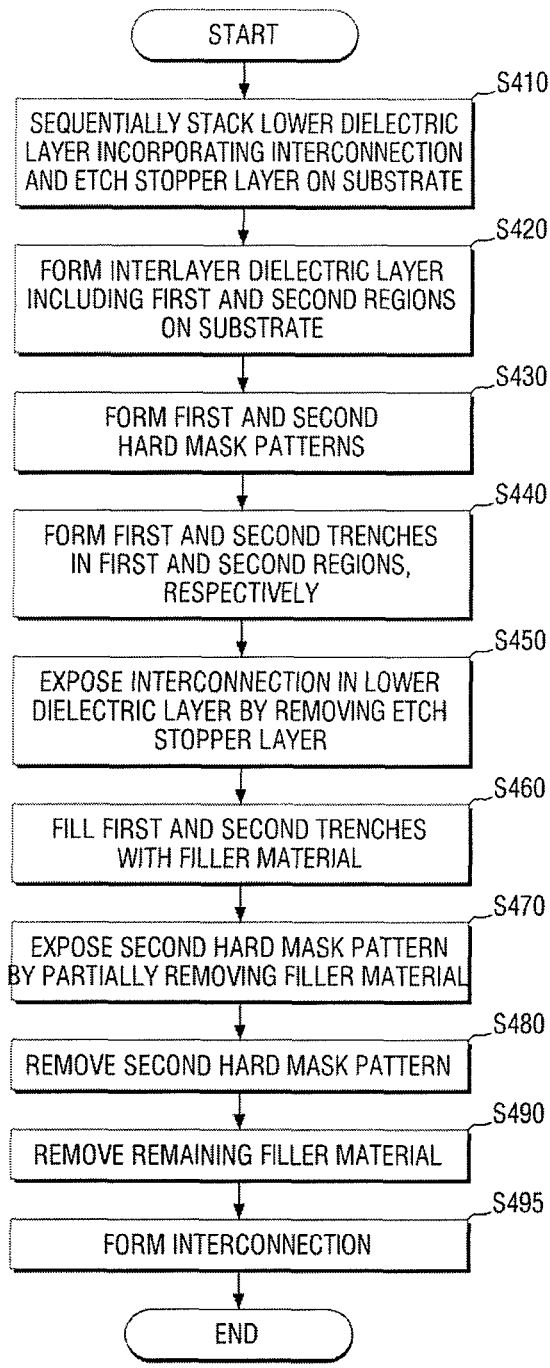
FIG. 31 is a flowchart illustrating a method for fabricating a semiconductor device according to a fourth embodiment of the present inventive concepts.

Hereinafter, a method for fabricating a semiconductor device according to a fourth embodiment of the present inventive concept will be described with reference to FIGS. 31 to 35. FIG. 31 is a flowchart illustrating a method for fabricating a semiconductor device according to a fourth embodiment of the present inventive concept, and FIGS. 32 to 35 are sectional views of intermediate structures for illustrating the method for fabricating a semiconductor device according to the flowchart of FIG. 31.

The method for fabricating a semiconductor device according to a fourth embodiment of the present inventive concept is different from the first and third embodiments and is similar to the second embodiment in that first and second trenches and first and second via holes are formed, and an etch stopper layer is removed prior to providing the filler material. For brevity of description, elements that can be fully deduced by one skilled in the art by referring to the previous embodiments will not be described in detail or will be briefly described.

First, referring to FIGS. 31 and 20 to 23B, a lower dielectric layer 10 including a wiring and an etch stopper layer 20 are sequentially stacked on a substrate 1 (S410). An interlayer dielectric layer 30 including first and second regions I and II is formed (S420). First hard mask patterns 40 and 41, and second hard mask patterns 50 and 51 are formed (S430). A first trench 70 and a second trench 71 are formed on the first and second regions I and II, respectively (S440). The method for forming the first trench 70, the first via hole 100, the second trench 71 and the second via hole 101 using the first hard mask patterns 40 and 41 and the second hard mask patterns 50 and 51 is substantially the same as that of the previous embodiment.

Figure 32:
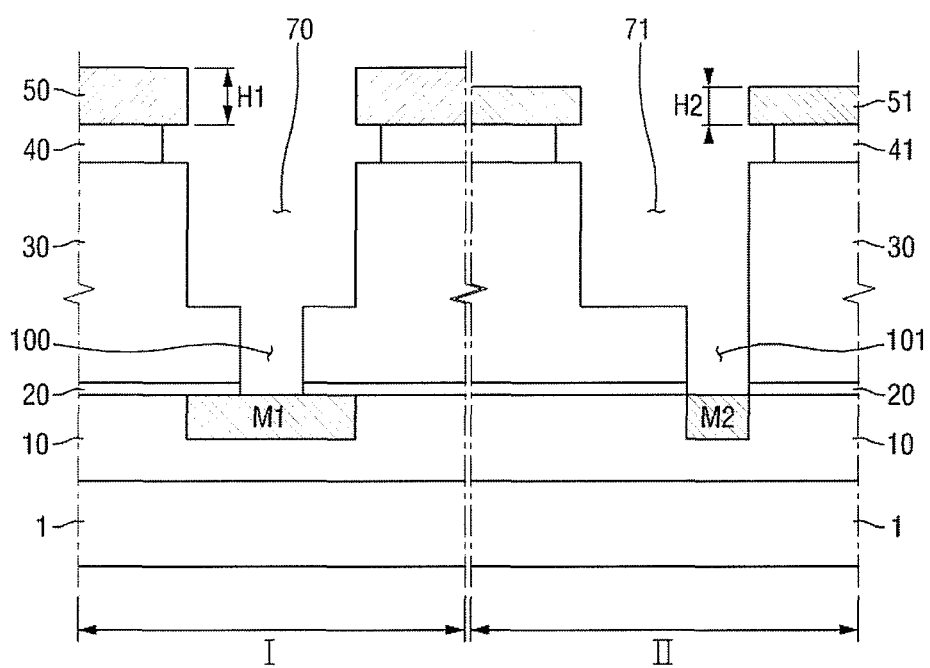
FIGS. 32 to 35 are sectional views of intermediate structures for illustrating the method for fabricating a semiconductor device according to the flow chart of FIG. 31.

Next, as shown in FIGS. 31 and 32, the etch stopper layer 20 is removed to expose a first wiring M1 and a second wiring M2 included in a lower dielectric layer 10 (S450). In more detail, the etch stopper layer 20 exposed by the first trench 70 and the first via hole 100 formed in the first region I is selectively removed to expose the first wiring M1 included in the first region I of the lower dielectric layer 10, and the etch stopper layer 20 exposed by the second trench 71 and the second via hole 101 formed in the second region II is selectively removed to expose the second wiring M2 included in the second region II of the lower dielectric layer 10. In some embodiments, the removing of the etch stopper layer 20 may include performing a wet etching process or a dry etching process.

Figure 33:
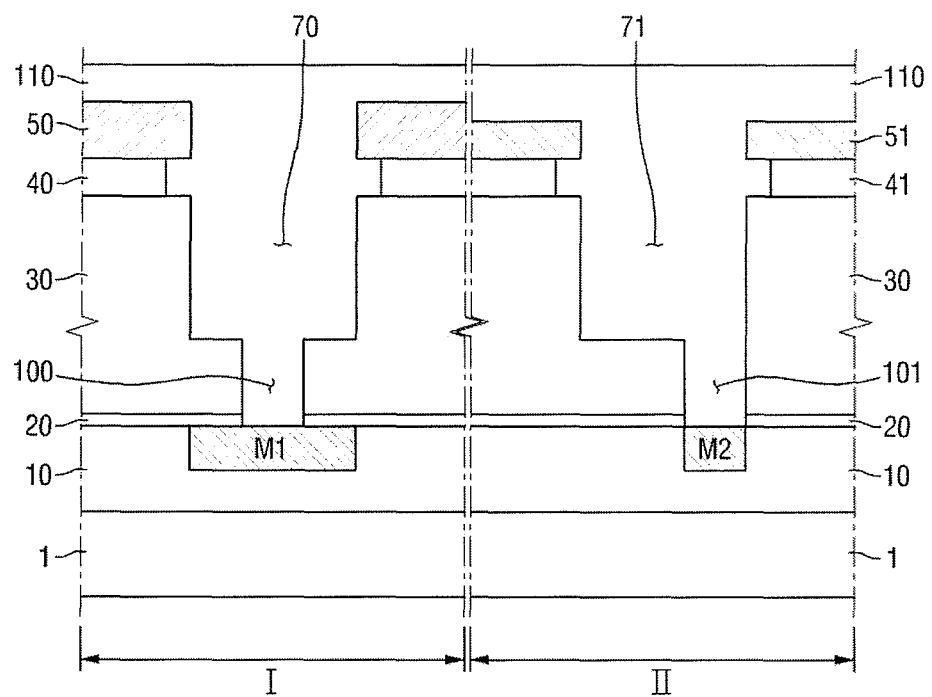

Referring to FIGS. 31 and 33, the first trench 70 and the second trench 71 are filled with a filler material 110 (S460). In more detail, the filler material 110 is formed on the interlayer dielectric layer 30 and the second hard mask patterns 50 and 51 to fill the first trench 70 and the first via hole 100 in the first region I and the second trench 71 and the second via hole 101 in the second region II. Here, the filler material 110 may be a material having suitable gap-filling characteristics and high planarity. For example, the filler material 110 may be a carbon-based material. Alternatively, the filler material 110 may include a spin-on-hardmask (SOH), nitride floating cap (NFC), a deep ultraviolet light absorbing oxide (DUO) material, and the like.

Further, the first trench 70 and the second trench 71 are filled with the filler material 110, thereby protecting the lower wirings M1 and M2 exposed by removing the etch stopper layer. As described herein, it is possible to prevent the lower wirings M1 and M2 and the interlayer dielectric layer 30 from becoming damaged by subsequent etching processes, since the filler material 110 is present.

Figure 34:
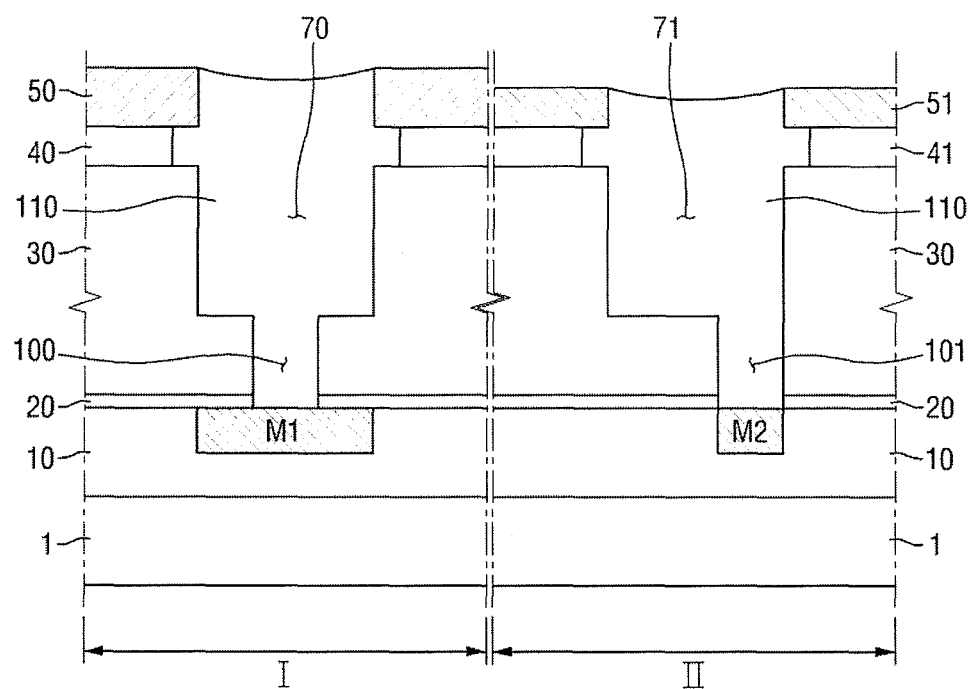

Referring to FIGS. 31 and 34, the second hard mask patterns 50 and 51 are exposed by partially removing the filler material 110 (S470). In more detail, in some embodiments, the filler material 110 present on the second hard mask patterns 50 and 51 may be removed by performing one of a CMP process, an etch back process or a combination thereof until upper surfaces of the second hard mask patterns 50 and 51 are exposed.

Figure 35:
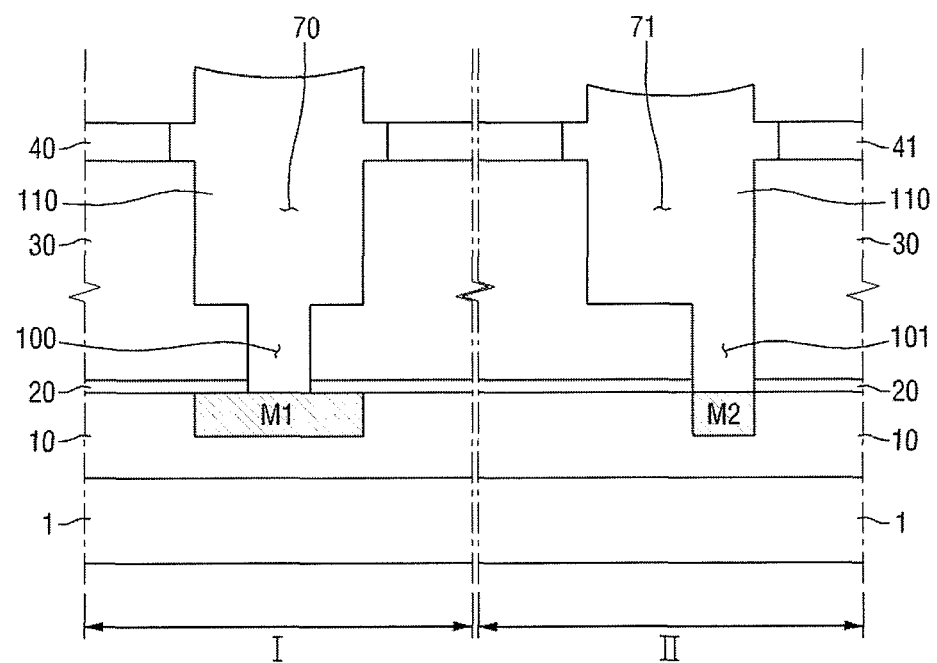

Next, referring to FIGS. 31 and 35, the second hard mask patterns 50 and 51 are removed (S480). In more detail, the second hard mask patterns 50 and 51 may be selectively removed by, for example, wet etching, or by other suitable processes. In a case where the second hard mask patterns 50 and 51 are formed of a material including TiN, examples of the etching solution may include SC1, a mixed solution of tetraethylammonium hydroxide (TEAH) and $H_2O_2$, and a mixed solution of tetramethylammonium hydroxide (TMAH) and $H_2O_2$.

Next, referring to FIGS. 31 and 28, the remaining filler material 110 is removed (S490). As described above, the selective removal of the filler material 110 may be performed by, for example, an ashing process. As the filler material 110 is removed, the lower wirings M1 and M2 may be exposed.

Referring to FIGS. 31, 29 and 30, a wiring is formed (S495). As in the other embodiments described herein, a barrier layer 120 and a conductive material 130 may be formed and planarized to expose a top surface of the interlayer dielectric layer 30, thereby forming a first damascene wiring 140 including a first via 145 and a second damascene wiring 141 including a second via 146.

While the present inventive concepts have been particularly shown and described with reference to exemplary embodiments thereof, it will be understood by those of ordinary skill in the art that various changes in form and details may be made therein without departing from the spirit and scope of the present inventive concepts as defined by the following claims. It is therefore desired that the present embodiments be considered in all respects as illustrative and not restrictive, reference being made to the appended claims rather than the foregoing description to indicate the scope of the inventive concept.

What is claimed is:

1. A method for fabricating a semiconductor device, the method comprising:
   providing a substrate including an interlayer dielectric layer and first and second hard mask patterns sequentially stacked thereon;
   providing a first trench in the interlayer dielectric layer through the second hard mask pattern and the first hard mask pattern;
   providing a filler material on the interlayer dielectric layer and the second hard mask pattern to fill the first trench;
   exposing an upper portion of the second hard mask pattern by partially removing the filler material;
   removing the second hard mask pattern;
   removing remaining filler material from the first trench; and
   forming a wiring by filling the first trench with a conductive material.

2. The method of claim 1, wherein the second hard mask pattern comprises a metal mask pattern.

3. The method of claim 2, wherein the second hard mask pattern comprises titanium nitride (TiN).

4. The method of claim 1, wherein the removing of the second hard mask pattern comprises selectively removing the second hard mask pattern using wet etching.

5. The method of claim 4, wherein the partially removing the filler material is performed using at least one of a chemical mechanical polishing (CMP) process, an etch-back process, or a combination thereof.

6. The method of claim 1, wherein the providing the substrate comprises providing a substrate including an etch stopper layer formed between the substrate and the interlayer dielectric layer, and a lower dielectric layer formed between the substrate and the etch stopper layer, the lower dielectric layer having a conductive contact formed therein.

7. The method of claim 6, wherein the removing the remaining filler material comprises exposing the etch stopper layer by removing the filler material, and, prior to filling the first trench with the conductive material, there is further provided exposing the conductive contact by removing the etch stopper layer exposed by the first trench.

8. The method of claim 6, further comprising, prior to the providing the filler material to fill the first trench, exposing the conductive contact by removing the etch stopper layer exposed by the first trench.

9. A method for fabricating a semiconductor device, the method comprising:
   providing a substrate including an interlayer dielectric layer thereon, the substrate including a first region and a second region;
   sequentially forming a first hard mask pattern and a second hard mask pattern on the interlayer dielectric layer in the first and second regions;
   providing a first trench in the interlayer dielectric layer in the first region and providing a second trench in the interlayer dielectric layer in the second region using the first hard mask pattern and the second hard mask pattern as etch masks;
   filling the first trench and the second trench by providing a filler material on the interlayer dielectric layer and the second hard mask pattern in the first and second regions;
   exposing an upper portion of the second hard mask pattern by partially removing the filler material;
   removing the second hard mask pattern;
   removing remaining filler material from the first trench and the second trench; and
   forming a wiring by filling the first trench and the second trench with a conductive material.

10. The method of claim 9, wherein after the providing of the first trench and the second trench, the first hard mask pattern in the first region has a first thickness, and the second hard mask pattern in the second region has a second thickness, wherein the first thickness is different than the second thickness.

11. The method of claim 9, wherein the second hard mask pattern comprises a metal mask pattern.

12. The method of claim 9, wherein the removing the second hard mask pattern comprises selectively removing the second hard mask pattern using wet etching.

13. The method of claim 9, wherein the providing the substrate comprises providing a substrate including an etch stopper layer between the substrate and the interlayer dielectric layer, and a lower dielectric layer between the substrate and the etch stopper layer and having a conductive contact formed therein.

14. The method of claim 13, wherein the removing the remaining filler material comprises exposing the etch stopper layer by removing the filler material, and prior to filling the first trench with the conductive material, there is further provided exposing the conductive contact by removing the etch stopper layer exposed by the first trench.

15. The method of claim 13, further comprising, prior to the filling the first trench, exposing the conductive contact by removing the etch stopper layer exposed by the first trench.

16. A method of fabricating a semiconductor device, comprising:
    providing a first hard mask layer on an interlayer dielectric film and providing a second hard mask layer on the first hard mask layer, the second hard mask layer having etch selectivity relative to the first hard mask layer;
    forming a trench through the second hard mask layer, the first hard mask layer and the interlayer dielectric film, the trench forming a first opening through the first hard mask layer and the trench forming a second opening through the second hard mask layer, the first opening being larger in area that the second opening;
    filling the trench with a filler material, the filler material filling the trench in the interlayer dielectric film, and the first and second openings;
    removing the second hard mask layer;
    removing filler material from the trench; and
    filling the trench with a conductive material to form an inter-layer wiring.

17. The method of claim 16 wherein filling the first trench further comprises the filler material covering upper portions of the second hard mask layer.

18. The method of claim 17 further comprising partially removing the filler material to expose upper portions of the second hard mask layer prior to removing filler material from the first trench.

19. The method of claim 16 wherein the interlayer dielectric film is provided on a substrate and further comprising an etch stopper layer between the substrate and the interlayer dielectric film, wherein the etch stopper layer is selectively removed at a bottom of the first trench prior to filling the first trench with the filler material.

20. The method of claim 16 wherein the interlayer dielectric film is provided on a substrate and further comprising an etch stopper layer between the substrate and the interlayer dielectric film, wherein the etch stopper layer is selectively removed at a bottom of the first trench after removing the filler material from the first trench.

* * * * *